United States Patent
Adachi et al.

(10) Patent No.: US 7,021,944 B2
(45) Date of Patent: Apr. 4, 2006

(54) SOCKET AND CONTACT OF SEMICONDUCTOR PACKAGE

(75) Inventors: Kiyoshi Adachi, Hiratsuka (JP); Masanori Yagi, Kanagawa (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/488,715

(22) PCT Filed: Oct. 2, 2002

(86) PCT No.: PCT/US02/31442

§ 371 (c)(1),
(2), (4) Date: Mar. 3, 2004

(87) PCT Pub. No.: WO03/030604

PCT Pub. Date: Apr. 10, 2003

(65) Prior Publication Data

US 2005/0070134 A1    Mar. 31, 2005

(30) Foreign Application Priority Data

Oct. 3, 2001    (JP)    ............... 2001-307468

(51) Int. Cl.
*H01R 12/00*    (2006.01)
*H05K 1/00*    (2006.01)

(52) U.S. Cl. ...................................... 439/71

(58) Field of Classification Search ............ 439/71, 439/83, 342, 747, 746
See application file for complete search history.

(56) References Cited

U.S. PATENT DOCUMENTS 5,938,451 A * 8/1999 Rathburn ................. 439/66

FOREIGN PATENT DOCUMENTS

JP    2001-167857    * 6/2001

* cited by examiner

*Primary Examiner*—Javaid H. Nasri
(74) *Attorney, Agent, or Firm*—Robert J. Zeitler

(57) ABSTRACT

The present invention is directed to a socket connector having a plurality of contacts for contacting with a plurality of solder balls arranged on one of the surface of a semiconductor package, and a socket body in which a plurality of mounting holes are provided for mounting respective contacts. The mounting hole is provided with a through-hole pierced in a height direction of the socket body and a contact support hole of the contact. Each contact is provided with an upright piece extending through the through-hole, and a support piece extending from the upright piece to be inserted into the support hole. A contact portion for contacting with the solder ball is formed at a tip end portion of the upright piece. The support piece extends from the proximal end portion of the upright piece.

9 Claims, 15 Drawing Sheets

PRIOR ART

PRIOR ART

PRIOR ART

PRIOR ART

SOCKET AND CONTACT OF SEMICONDUCTOR PACKAGE

FIELD OF THE INVENTION

The present invention relates to a socket of a semiconductor package provided with a plurality of contacts for contacting with a plurality of solder balls arranged in an array on one side of the semiconductor package, and such contacts.

BACKGROUND OF THE INVENTION

Recently, the reduction of a pitch of integrated circuits has been advancing due to the demand of miniaturization of information processing equipment and high-speed performance thereof. In accordance with this, the actual mounting system is changing from a through-hole type to a surface mounting type and the arrangement of terminals is changing from a peripheral arrangement to an array arrangement. Furthermore, of such array arrangements, a ball grid array (BGA) in which solder balls are arranged in an array-like arrangement on a surface of a package is becoming a main type of a package on which the terminals may be mounted on the surface.

In the case where a socket is used between a BGA type integrated circuit and a substrate, in some cases, the socket may be actually mounted on the substrate for interchanging the integrated circuits in addition to the case where the integrated circuits are subjected to a burn-in test or a high frequency test by using a test socket. In the socket, it is necessary to positively contact all the contacts with both terminals of the integrated circuits and terminals formed on the substrate to keep a sufficient electrical conductivity.

On the other hand, it is required to reduce the inductance with respect to a higher speed clock as the density or the operational speed of the integrated circuit is increased. In order to meet this requirement, it is necessary to make a path length of current in contacts (interval between contact portions), which are interposed between the terminals of the integrated circuit and the terminals of the substrate, as small as possible.

Conventionally, for example, a socket of a semiconductor package having a plurality of solder balls arranged in an array is disclosed in Japanese Patent Application Laid-Open No. Hei 8-222335.

The socket 300 of the publication is provided with a contact 305 as shown in FIGS. 12 to 16. This contact 305 is formed by punching a metal plate out and is provided with a base body 302 having side walls 301 on both sides and having a substantially U-shaped cross-section, a substantially C-shaped contact piece 303 having elasticity, projecting toward the side walls 301 from a lower portion of the body 302 and extending above the body 302, a contact portion 303a provided in the vicinity of a tip end of the contact piece to be brought into contact with a solder ball S of an IC package 400, and a contact portion 304 projecting from the lower end portion of the body 302 in a direction opposite to that of the contact piece 303.

In this test socket, in order that the solder ball S pressingly contacts the contact portion 303a, the contact piece 303 is formed into a leaf spring having an arcuate shape. For this reason, it is difficult to shorten the length of an electric path from the contact portion 303a to the contact portion 304. Thus, it is impossible to decrease the self-inductance. This causes a problem that the test or evaluation of the semiconductor package could not be performed with high precision in a high frequency range. The same problem arises also in the case of a socket comprising a contact in which, as shown in FIG. 16, contact portions are formed at its respective upper and lower ends, and a spring is provided between the contact portions. Further, since the contact is brought into contact with the solder ball only at one point, contact precision is somewhat lower as compared with the case where it contacts with the solder ball at two points.

As a technique for solving such a problem, a socket shown in FIG. 16 is known. A contact 310 formed substantially into a U-shape is press-fit and fixed to the socket body 311, and the portion of upright piece 313 except for a fixture region 312 can be elastically deformed. Thus, when the contact portions 314 are brought into contact with the solder ball 315, the upright pieces 313 are elastically deformed so as to avoid damaging the solder ball 315. Furthermore, a height (thickness) of the socket can also be reduced.

However, also in this technique, there are problems to be solved as described below. Namely, these are problems associated with the requirement of further reduction of height of the socket. In the socket shown in FIG. 16, the length of the upright piece 313 that may be elastically deformed is shortened due to the existence of the fixture region 312. For this reason, there is a problem that it is difficult to further reduce the height thereof. Furthermore, since a maximum dimension of the contact 310 is elongated, it is impossible to further reduce the inductance.

In particular with respect to the reduction in height of the socket, if the portion of the upright piece 313 that may be elastically deformed is shortened due to the further reduction in height of the socket, the elasticity is degraded so that the load imposed on the solder ball 315 is increased to cause the problem of damaging the solder ball 315.

As a technique for reducing the height of the socket, there is a contact sheet described in Japanese Patent Application Laid-Open No. 2001-167857, in which a contact spring is formed by a plurality of cantilevers having spherical terminal holding portions.

In the contact sheet described in the publication, since all the cantilevers are arranged on a planar surface with respect to the sheet, it is possible to ensure the advantage of the further reduction in height but there is a problem that the arrangement thereof at a high density is impossible. Namely, since the plurality of cantilevers are laid horizontally on the planar surface, the area occupied by one contact spring is increased. As a result, the high-density arrangement is impossible.

OBJECT AND SUMMARY OF THE INVENTION

An object of the present invention is to provide a technique for a socket and a contact of a semiconductor package, which may reduce self-inductance and enables high-density arrangement by reducing a height of the socket, and which also takes into consideration the contact reliability of a contact portion.

The present invention adopts the following structure in order to solve the above-described problems. A socket of a semiconductor package according to the present invention is provided with a plurality of contacts for contacting with a plurality of solder balls arranged on one side of the semiconductor package, and a socket body in which a plurality of mounting holes are provided for mounting the respective contacts. Each of the mounting holes is provided with a through-hole pierced in a height direction of the socket body and a contact support hole. Each contact is provided with an upright piece extending through the through-hole and a support piece extending from the upright piece to be inserted into the through-hole. A contact portion for contacting with the solder ball is formed at a tip end portion of the upright piece, and the support piece extends from a proximal end portion of the upright piece.

According to the present invention, the mounting hole of the contact is provided with the through-hole and the support hole, and the contact is provided with the upright piece extending along the through-hole and the support piece extending from the upright piece to be inserted into the support hole. Accordingly, the upright piece is supported to the support piece so that it may be elastically deformed. As a result, it is possible to effectively utilize the full length of the upright piece as a portion that may be elastically deformed. Thus, it is possible to reduce the self-inductance by the further reduction in height of the socket. Also, since the upright piece extends along the through-hole, it is possible to realize high-density arrangement in comparison with the case where the contacts are arranged in a horizontal manner.

It is preferable that the through-hole is set to a size such that the upright piece may be shifted within its interior. Thus, since the upright piece can be shifted within the interior of the through-hole, it allows freedom as to, rather than restricts, the movement of the upright piece as a whole to thereby enhance the independency of the upright piece. Thus, it is possible to form the contact that is durable by using the length of the effective spring portion as the full length of the upright piece.

It is preferable that a pull-off preventing projection for preventing pull-off of the support piece is provided between the support hole and the support piece. By means of the pull-off preventing projection, it is possible to fix the support piece securely to the support hole, and at the same time to readily mount the support piece to the support hole, thus contributing also to the ease of manufacture.

It is preferable that the socket body is formed into a planar shape, the contact portion of each contact is arranged on its surface side, the proximal end portion of each contact is arranged on the back surface side and each proximal end portion projects from the back surface. With such an arrangement, since the proximal end of each contact projects from the back surface of the socket body, it is possible to directly utilize the proximal end portion as a terminal. For example, it is possible to take a structure in which the socket is arranged on the circuit substrate and the proximal end portion of each contact is brought into contact with the terminal provided on the surface of the circuit substrate. Thus, it is possible to effectively utilize the full length of the upright piece. This also contributes to the reduction in height.

It is possible to take a structure in which a recess portion having a uniform depth is provided on the top surface side of the socket body and at least the contact portion of each contact is exposed within the recess portion. The recess portion is provided on the top surface side of the socket body so that the contact portion of each contact is exposed to thereby impart a large degree of freedom to the movement of each contact portion. As a result, it is possible to design a size of the through-hole to be smaller.

It is preferable that a first curved portion that is curved in a U-shape and an inverted U-shaped second curved portion that is continuous with the first curved portion are formed between the upright piece and the support piece of the contact. In this case, the first curved portion exhibits the effect of making the upright piece elastically deformable and the second curved portion exhibits the effect of making the support piece and the upright piece substantially in parallel with each other.

It is preferable that the above-described second curved portion is located in the vicinity of a substantially central portion of a length of the upright piece. Thus, the second curved portion is located in the vicinity of the substantially central portion of the length of the upright piece whereby it is possible to take a compact structure of the support piece including the first and second curved portions.

It is possible to take an arrangement in which a convex portion extending from an inner wall of the mounting hole is provided in the mounting hole, and the convex portion is fitted into the second curved portion of the contact. The convex portion is fitted in the second curved portion whereby the support piece is positively positioned and fixed to the socket body.

It is preferable that contact portions of a pair of contacts are mounted to face each other in the mounting hole. With such an arrangement of the contacts, it is possible to bring the contacts into contact with the solder ball at two points to enhance the contact reliability.

On the other hand, a contact according to the present invention for being mounted on a socket body for contacting with a plurality of solder ball arranged on one surface of a semiconductor package is provided with an upright piece formed by machining a conductive metal plate and formed with contact portions relative to solder balls at a free end portion, and a support piece extending from a proximal end side of the upright piece so that the upright piece is supported to the socket body.

A contact according to the present invention is provided with the upright piece and the support piece. The support piece extends from the proximal end side of the upright piece. Accordingly, the upright piece is supported to the support piece to be elastically deformable. As a result, it is possible to effectively utilize the full length from the free end to the proximal end of the upright piece as a portion that may be elastically deformed. Thus, it is possible to reduce the self-inductance by the further reduction in height of the socket.

It is preferable that a first curved portion that is curved in a U-shape and an inverted U-shaped second curved portion that is continuous with the first curved portion are formed between the upright piece and the support piece of the contact. In this case, the first curved portion exhibits the effect of making the upright piece elastically deformable and the second curved portion exhibits the effect of making the support piece and the upright piece substantially in parallel with each other.

It is preferable that a pull-off preventing projection for preventing pull-off from the socket body is provided in the support piece. With the pull-off preventing projection, it is possible to positively fix the support piece to the socket body, and it is easy to mount the support piece to the socket body, thus also contributing to the ease of manufacturing.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENT

Figure 1:
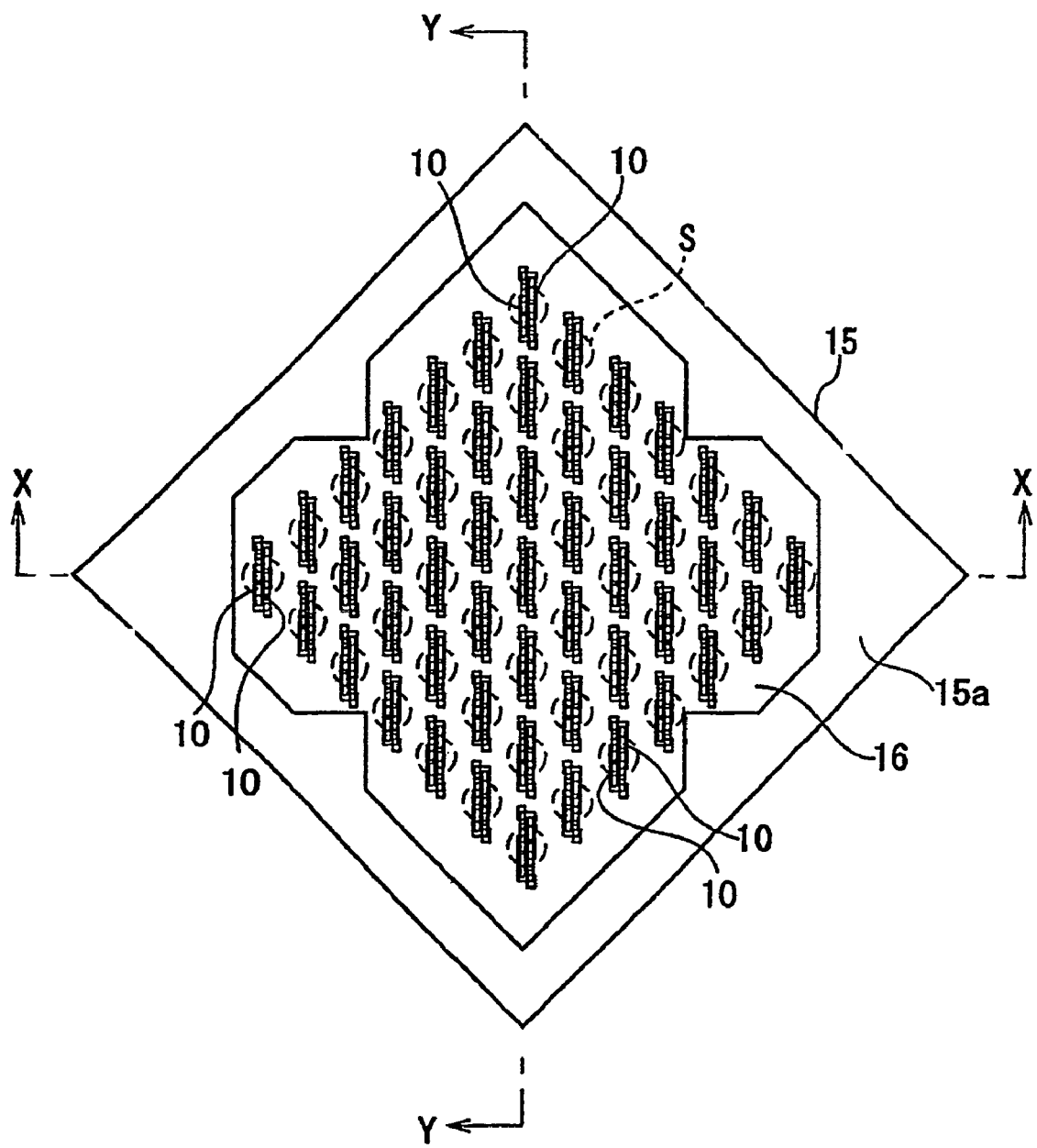
FIG. 1 is a plan view of a test socket of a semiconductor package in accordance with the present invention.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 2:
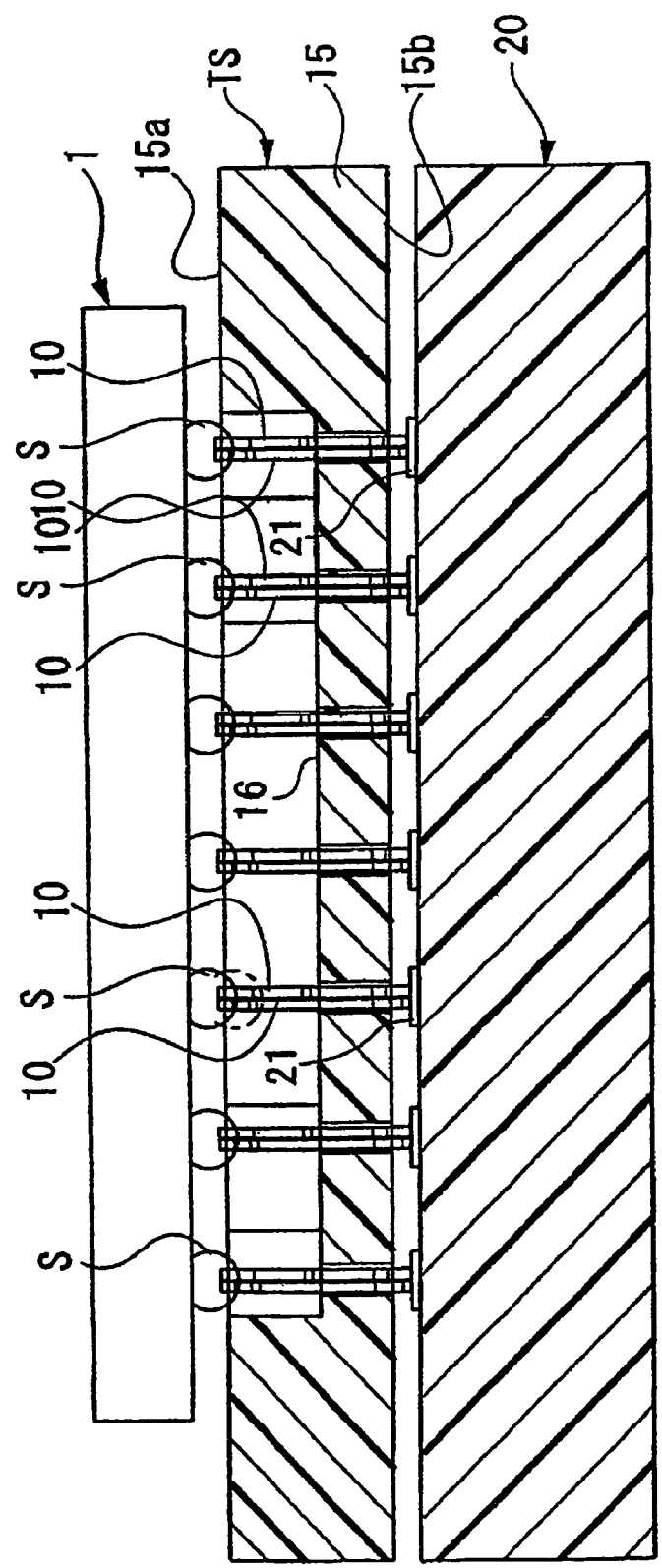
FIG. 2 is a cross-sectional view taken along the line X—X of FIG. 1.
Figure 3:
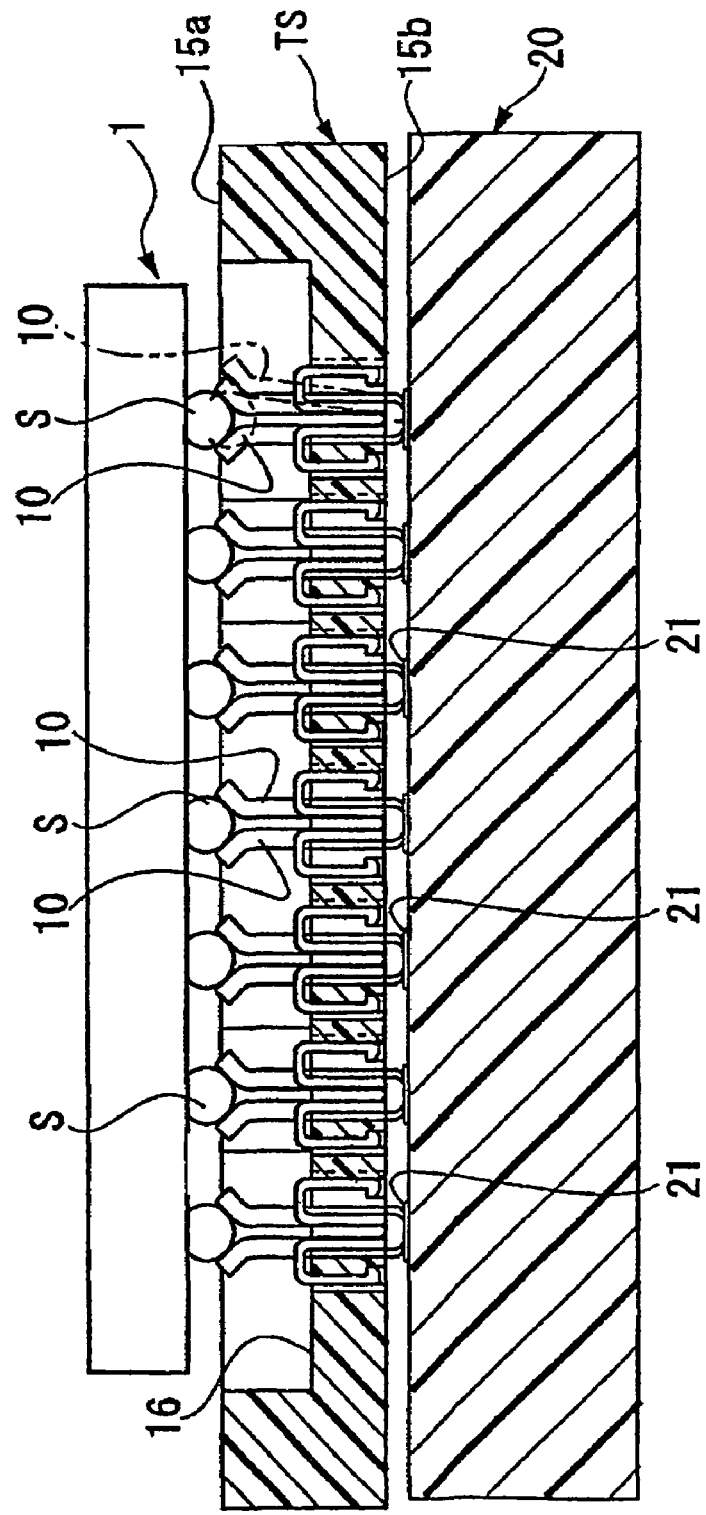
FIG. 3 is a cross-sectional view taken along the line Y—Y of FIG. 1.
Figure 4:
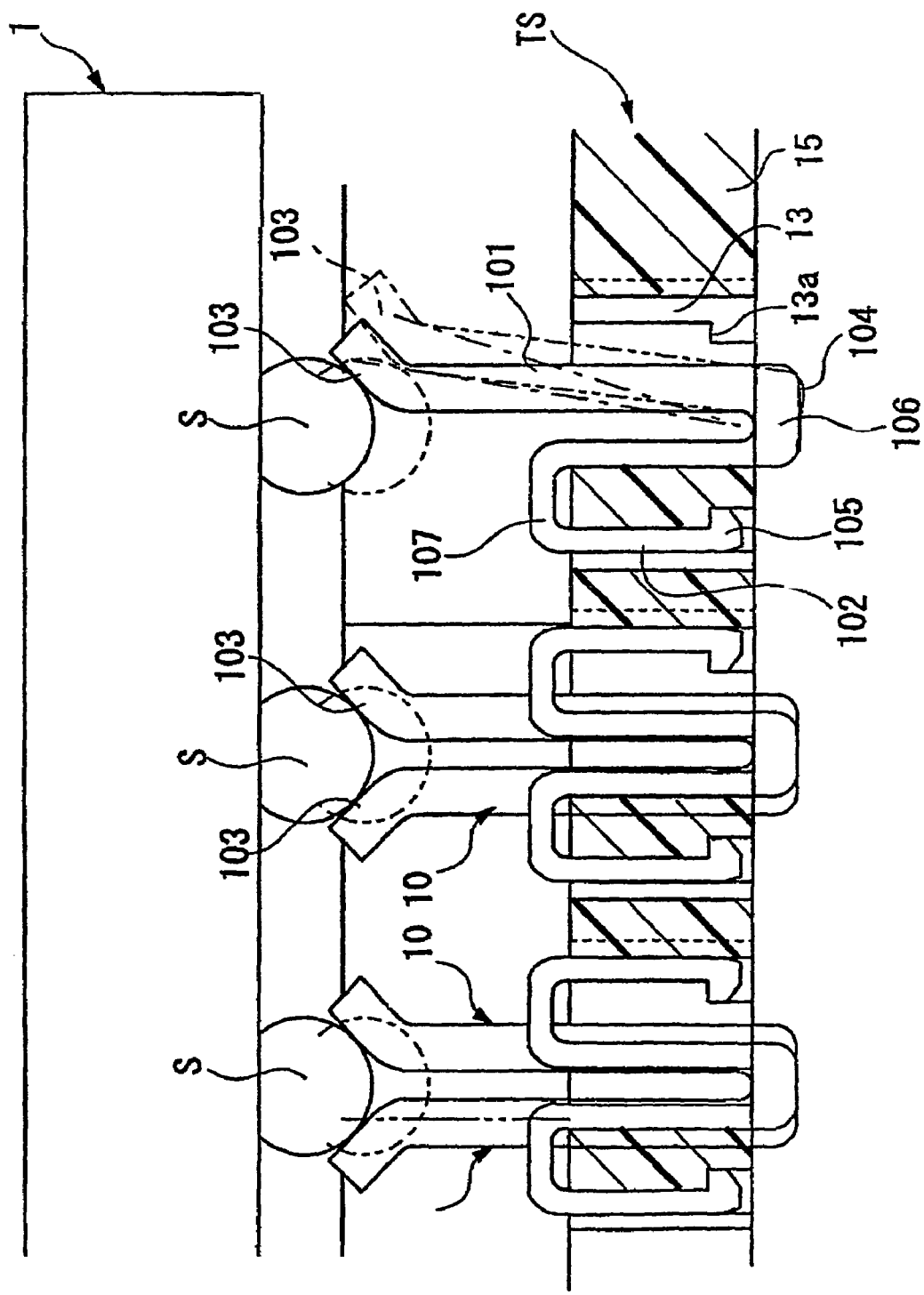
FIG. 4 is a partially enlarged view of FIG. 3.
Figure 5:
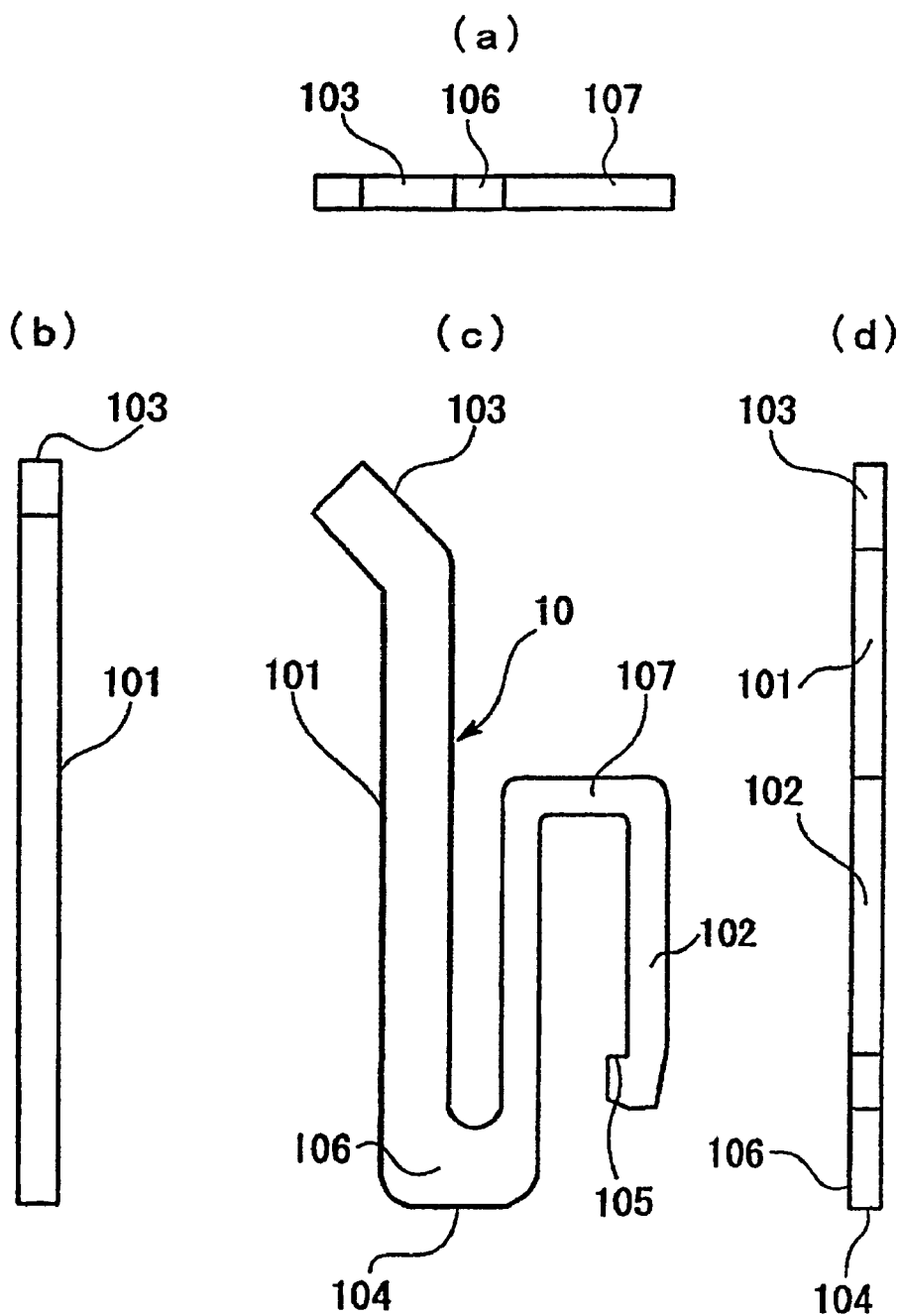
FIG. 5 is a view of the contact according to the present invention, in which (a) is a plan view, (b) is a frontal view, (c) is a right side elevational view and (d) is a rear view.
Figure 6:
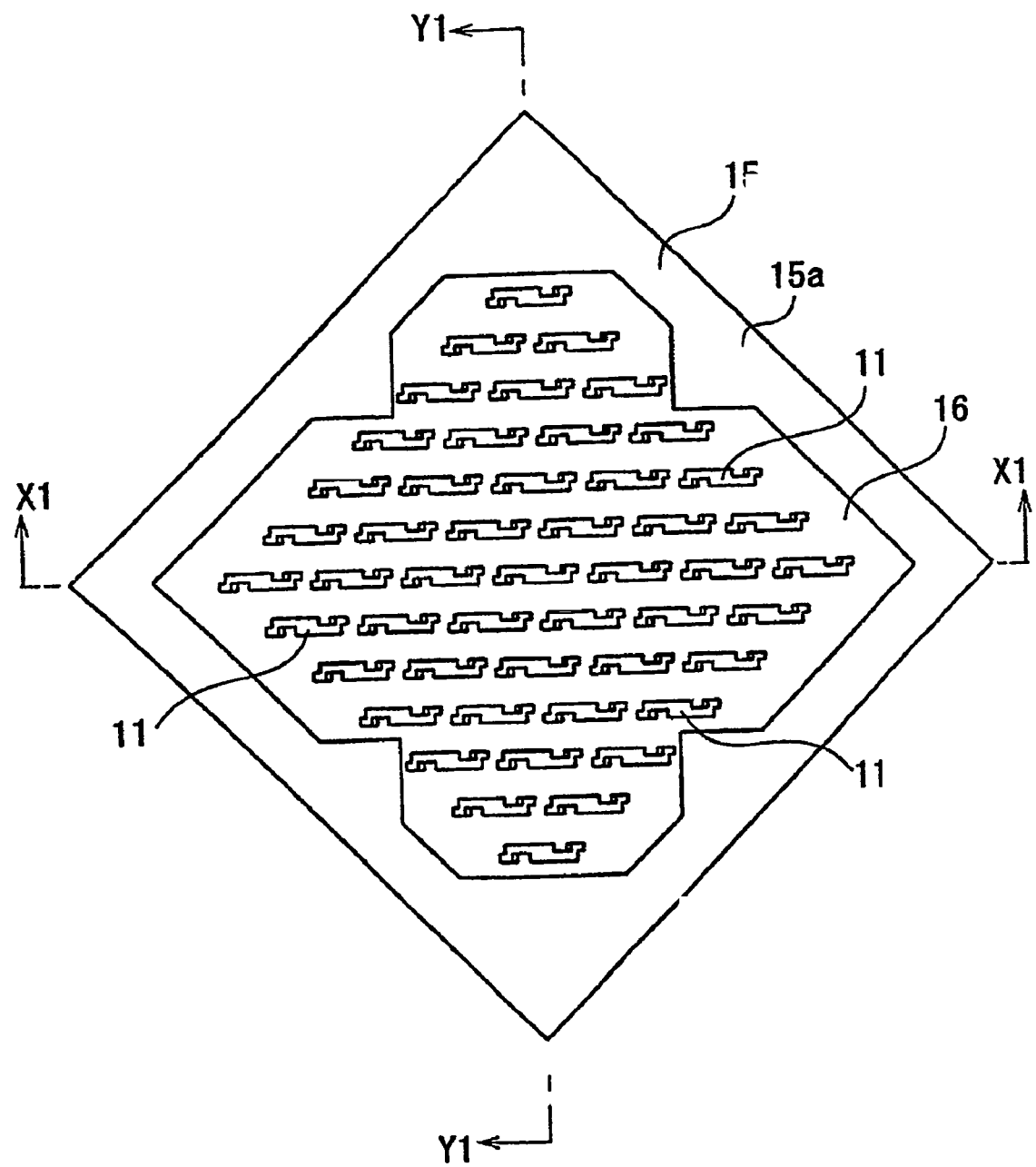
FIG. 6 is a plan view of the socket body in accordance with the present invention.

FIG. 1 is a plan view of a socket (test socket) of a semiconductor package in accordance with the embodiment of the present invention. FIG. 2 is a cross-sectional view taken along the line X—X of FIG. 1. FIG. 3 is a cross-sectional view taken along the line Y—Y of FIG. 1. FIG. 4 is a partially enlarged view of FIG. 3. FIG. 5 is a view illustrating a contact, and FIG. 6 is a plan view of the socket.

The test socket TS shown in these drawings is a BGA (Ball Grid Array) testing and evaluating socket of a semiconductor package 1 having a plurality of solder balls S arranged in an array on its one surface (bottom surface) side.

This test socket TS is provided with a plurality of contacts 10 arranged in an array, in a manner corresponding to the arrangement of the solder balls S of the semiconductor package 1, and a socket body (housing) 15 provided with a plurality of mounting holes 11 to which the respective contacts 10 are mounted. The mounting holes 11 are provided with through-holes 12 pierced in a height direction of the socket body 15 and support holes 13 for the contacts 10.

Then, each contact 10 is provided with an upright piece 101 extending along the through-hole 12 and a support piece 102 extending from the upright piece 101 to be inserted into the support hole 13. A contact portion 103 to be in contact with the solder ball S is formed at a free end (an upper end portion) of the upright piece 101. The support piece 102 extends from a proximal end (a lower end portion) of the upright piece 101.

With respect to the through-hole 12 of the mounting hole 11, it is set to such a size that the upright piece 101 may be shifted within its interior. Namely, the shape of the through-hole 12 is formed to be sufficiently larger than the cross-sectional shape of the upright piece 12. The upright piece 101 is adapted to be readily shifted within the interior of the through-hole 12, thereby allowing freedom as to, rather than restricting, the movement of the upright piece 101 as a whole in order to enhance the independency of each upright piece 101. Thus, it is possible to form the contact that has high durability by using the full length of the upright piece 101 as a length of an effective spring portion. Also, the elasticity of the spring is increased whereby, upon contact with the solder ball S, the load on the solder ball S is reduced and at the same time, it is possible to cope with the non-uniformity in heights of the solder balls in the thickness direction (height direction) of the socket body 15.

Pull-off preventing projections 105 for preventing pull-off of the support piece 102 are provided between the support hole 13 and the support piece 102. The support piece 102 can be reliably secured to the support hole 13 by the pull-off preventing projections 105 and at the same time it is possible to readily mount the support piece 102 to the support hole 13, thus contributing also to the ease of manufacture.

Figure 7:
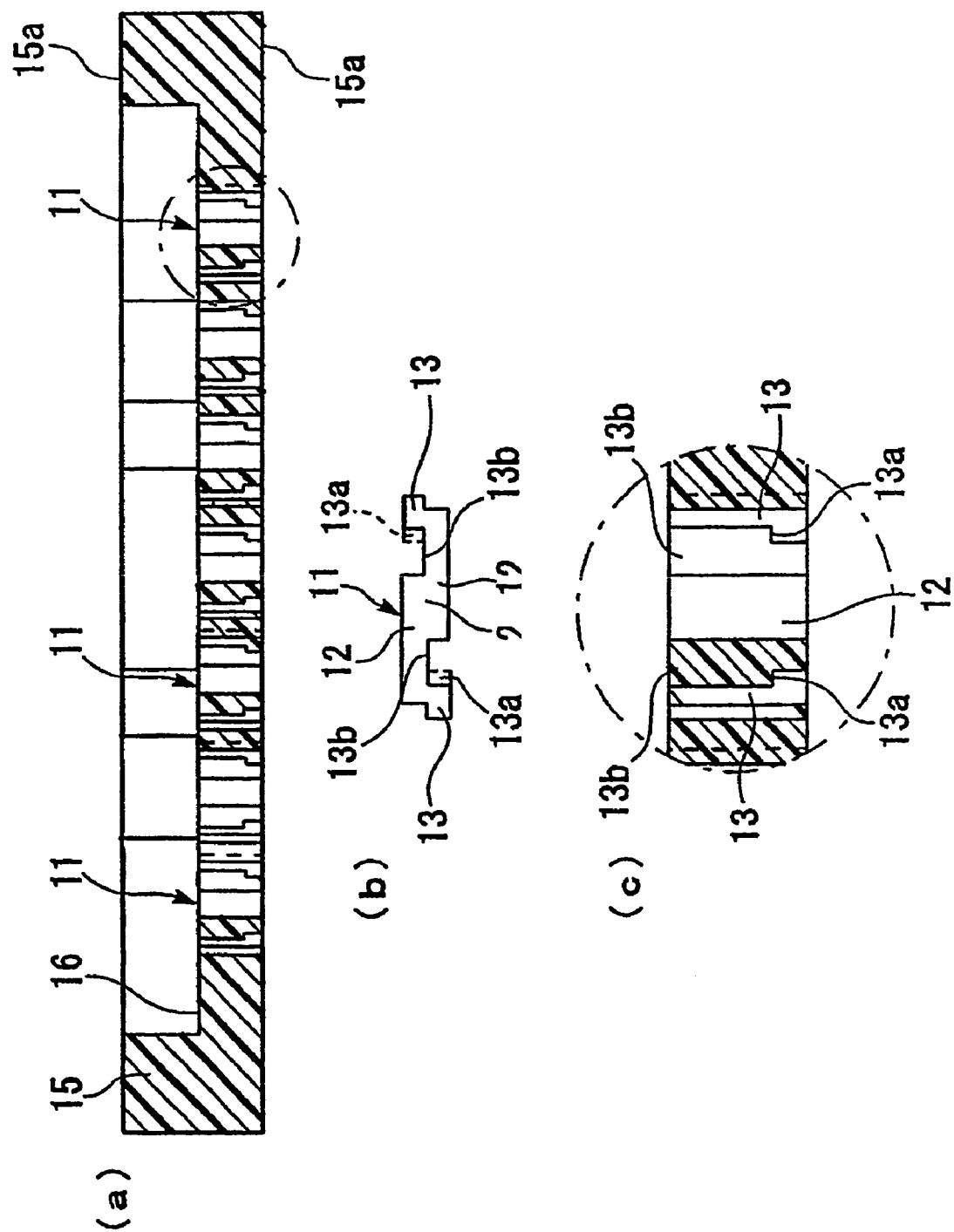
FIG. 7 is a view showing the socket body in accordance with the present invention, in which (a) is a cross-sectional view taken along the line X1—X1 of FIG. 7, (b) is a plan view of the mounting hole, and (c) is a partially enlarged view of (a).
Figure 8:
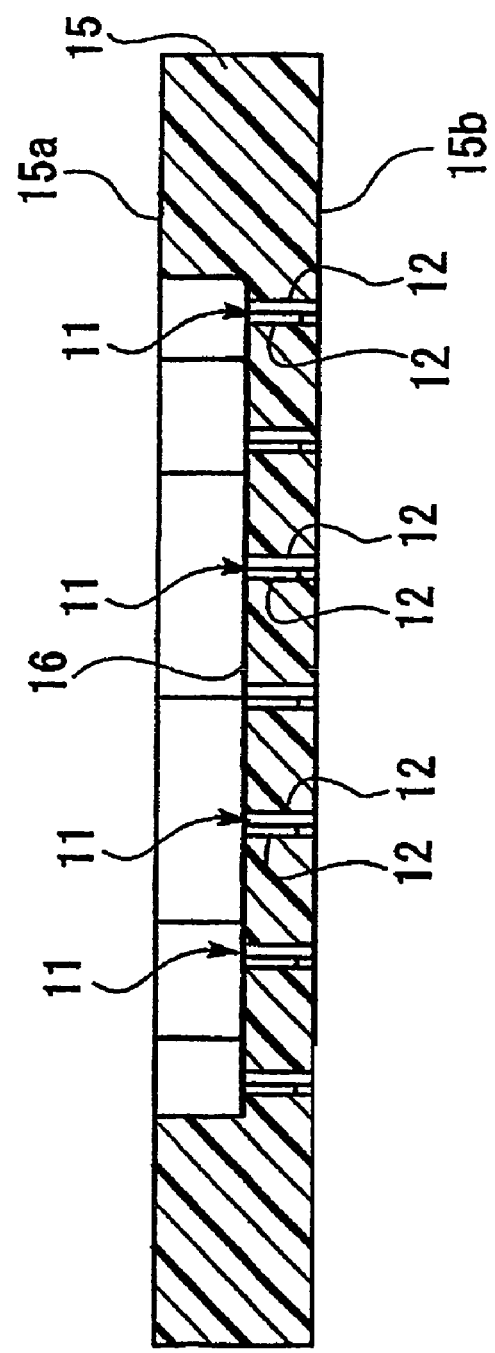
FIG. 8 is a cross-sectional view taken along the line Y1—Y1 of FIG. 7.

As shown in FIGS. 6 to 8, the socket body 15 is formed into a planar shape of synthetic resin having insulating properties. The contact portion 103 of each contact 10 is arranged on the side of the surface 15a thereof (see FIGS. 9 and 10). The proximal end portion 104 of the contact 10 is arranged on the side of the back surface 15b (see FIG. 11). Each proximal end portion 104 projects from the back surface 15b.

Namely, the proximal end portion 104 of the contact 10 is caused to project from the back surface 15b of the socket body 15 to thereby enable direct use of the proximal end portion 104 as a terminal. In this case, the test socket TS is arranged on the circuit substrate 20 so that the proximal end portion 104 of each contact 10 is brought into contact with the terminal 21 provided on the surface of the circuit substrate 20. Thus, it is possible to effectively utilize the full length of the upright piece 101. This also contributes to the reduction in height.

A recess portion 16 having a uniform depth is provided on the side surface 15a of the socket body 15, and at least the contact portion 103 of each contact 10 is exposed in the recess portion 16. The recess portion 16 is provided on the side of the surface 15a of the socket body 15 to thereby expose the contact portion 103 of each contact 10 and to make it possible to impart a greater degree of freedom as to the movement of each contact portion 103. As a result, it is possible to make the through-hole smaller.

As shown in FIG. 5, a first curved portion 106 that is curved into a U-shape and a second curved portion 107 having an inverted U-shape which is continuous the first curved portion 106 are formed between the upright piece 101 and the support piece 102 of the contact 10. Of the two curved portions, the first curved portion 106 is adapted to enable elastic deformation of the upright piece 101 and the second curved portion 107 is adapted to make the support piece 102 substantially in parallel with the upright piece 101. In this case, the manner in which the upright piece 101 is elastically deformed includes a case where, for example, the contact portion 103 is shifted in the horizontal or vertical direction in the case where the upright piece 101 itself is curved.

The second curved portion 107 is located in the vicinity of the substantially central portion of a length of the upright piece 101. Thus, the second curved portion 107 is located in the vicinity of the substantially central portion of the length of the upright piece 101 whereby it is possible to take a compact structure of the support piece 102 including the first and second curved portions 106 and 107.

As shown in FIG. 7(b), the mounting hole 11 is provided with convex portions 13b projecting from the inner wall of the mounting hole 11. The convex portion 13b is fitted in the second curved portion 107 of the contact 10. Thus, the support piece 102 may be positively positioned and fixed to the socket body 15.

The contact portions 103 of a pair of contacts 10 are mounted to face each other in the mounting hole 11. In actuality, as shown in FIGS. 1 and 2, the side walls of the contacts 10 are arranged to face each other in partial area contact with each other. Accordingly, both contacts 10 are electrically connected to each other through the area contact portion and at the same time, the contact portions 103 of the pair of contacts 10 are arranged to face each other to be offset in the right and left directions by a thickness of the contacts 10. Also, as clearly shown in FIG. 4, an interval is formed between the facing contact portions 103. Furthermore, a slant surface is formed in each contact portion 103.

Accordingly, since the solder ball S is spherical, when the pair of facing contact portions 103 are brought into contact with the solder ball S, the contact portions exhibit the effect of separating from each other due to the elasticity of the respective upright pieces 101. Thus, the contacts are brought into contact with the solder ball S at two points to enhance the reliability of contact.

In the embodiment, for the sake of explanation, the explanation has been given to the single contact 10. However, in actuality, the structure in which the contacts 10 are arranged to face each other as a pair is used as a single contact. This point is clearly shown in FIG. 3. Namely, the proximal end portions 104 of the two contacts 10 facing each other are in contact with the single terminal 21 provided on the surface of the circuit substrate 20. The same contacts are used in these contacts 10. Accordingly, a structure using only a single kind of contact is attained.

In order to arrange a pair of contacts 10 in the form in which the contact portions 103 face each other in each mounting hole 11 of the socket body 15, the shape of each mounting hole 11 is important. Namely, two through-holes 12 including the common hole 2 portions in the middle, the two support holes 13, the two engagement portions 13a and the two convex portions 13b are formed in the single mounting hole 11 of the socket body 15.

The engagement portion 13a is a portion with which the pull-off preventing projection 105 of the contact 10 is engaged. The engagement portion 13a is provided in the vicinity of the lower portion of the support hole 13. Accordingly, the support piece 102 is inserted from above into the support hole 13 to thereby engage the pull-off preventing projection 105 with the engagement portion 13a, and at the same time, the convex portion 13b is fitted in the inside of the second curved portion 107.

Under the condition in which the pair of contacts 10 is mounted within the mounting hole 11, parts of the side walls of the contacts 10 are brought into area contact with each other at the portion of the central common hole 2 to be electrically connected to form a single contact (terminal). In this case, the proximal end portion 104 of each contact 10 is caused to somewhat project from the back surface 15b of the socket body 15 to form a contact portion to the terminal 21 of the circuit substrate 20.

Thus, since each contact 10 is not press fit into the through hole 11 of the socket body (housing) and is mounted in a simple fitting condition, each contact may be somewhat shifted up and down. Thus, it is possible to absorb the non-uniformity in the positions of the proximal end portions (tails) 104 that form the contact portions with the circuit substrate 20.

Figure 9:
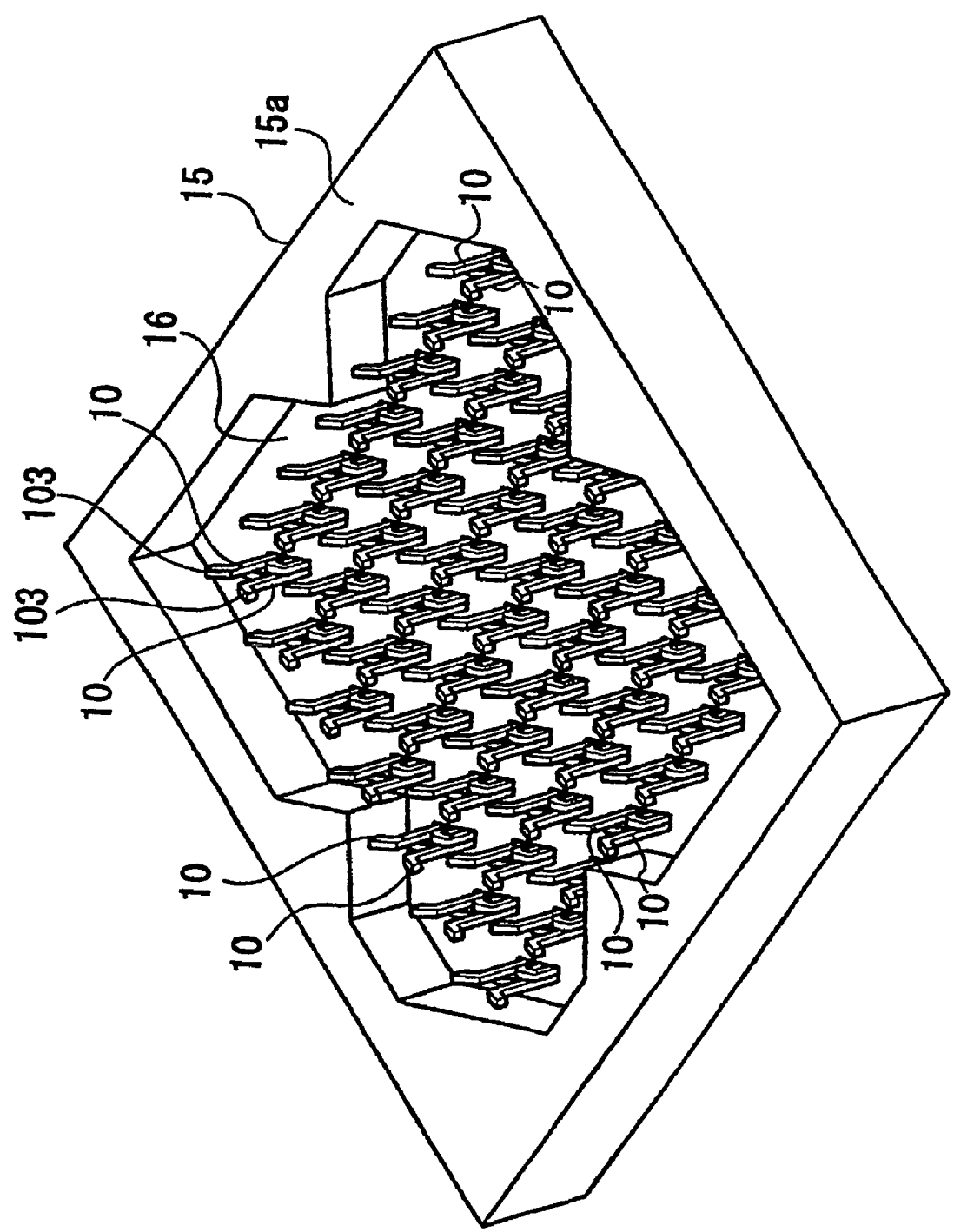
FIG. 9 is a perspective view of the test socket of the semiconductor package according to the present invention.
Figure 10:
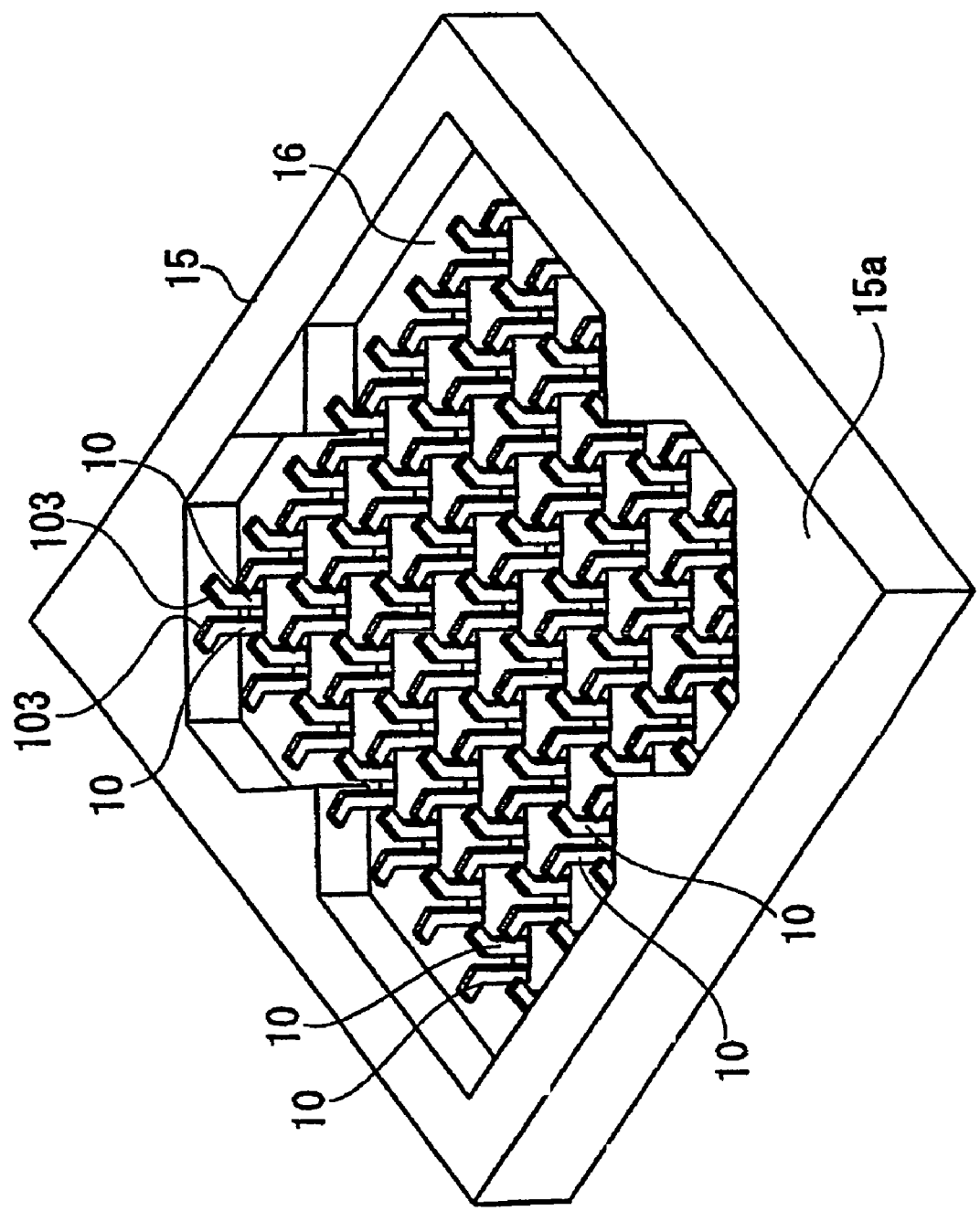
FIG. 10 is a perspective view of the test socket of the semiconductor package according to the present invention.
Figure 11:
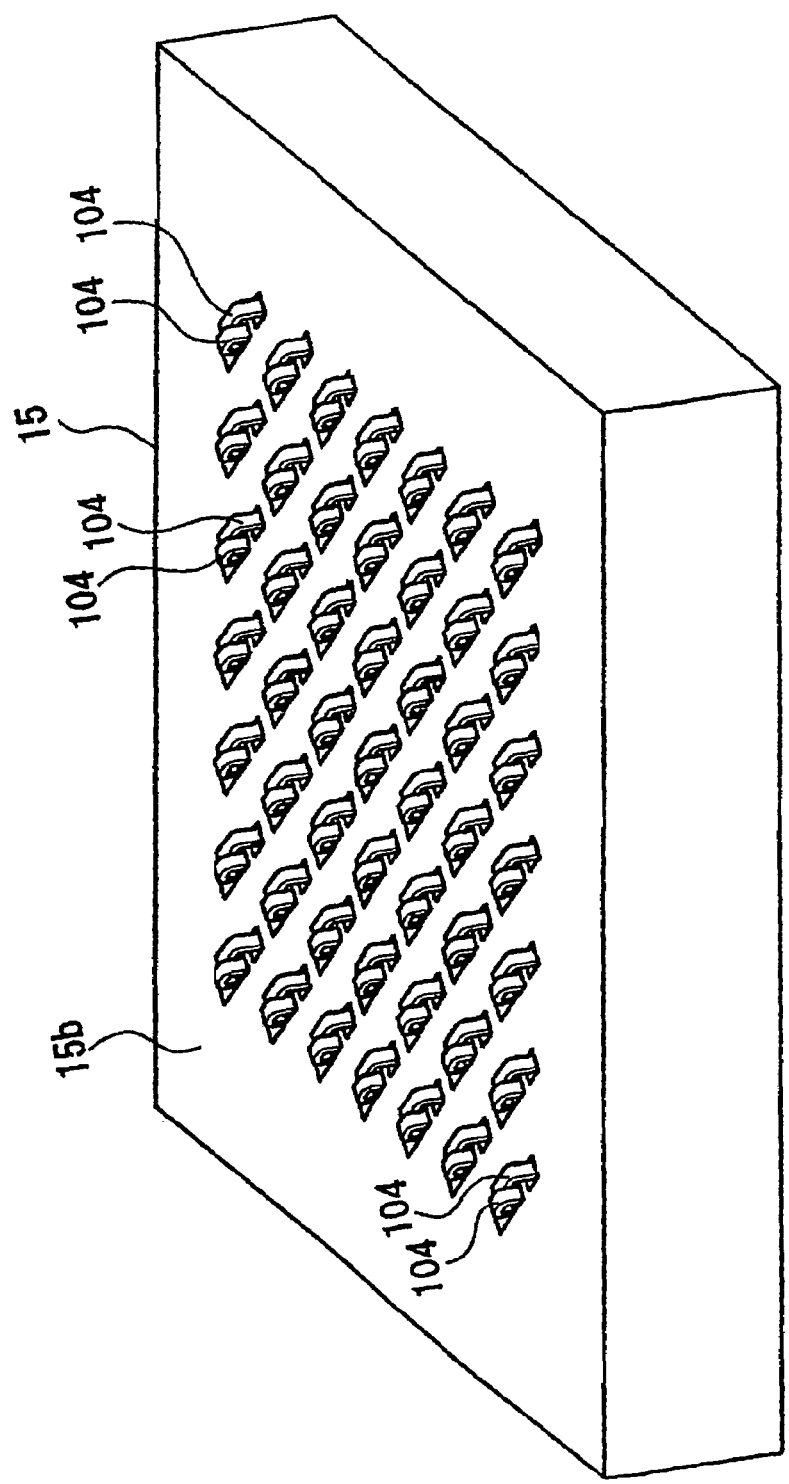
FIG. 11 is a perspective view of a back surface side of the test socket of the semiconductor package according to the present invention.
Figure 12:
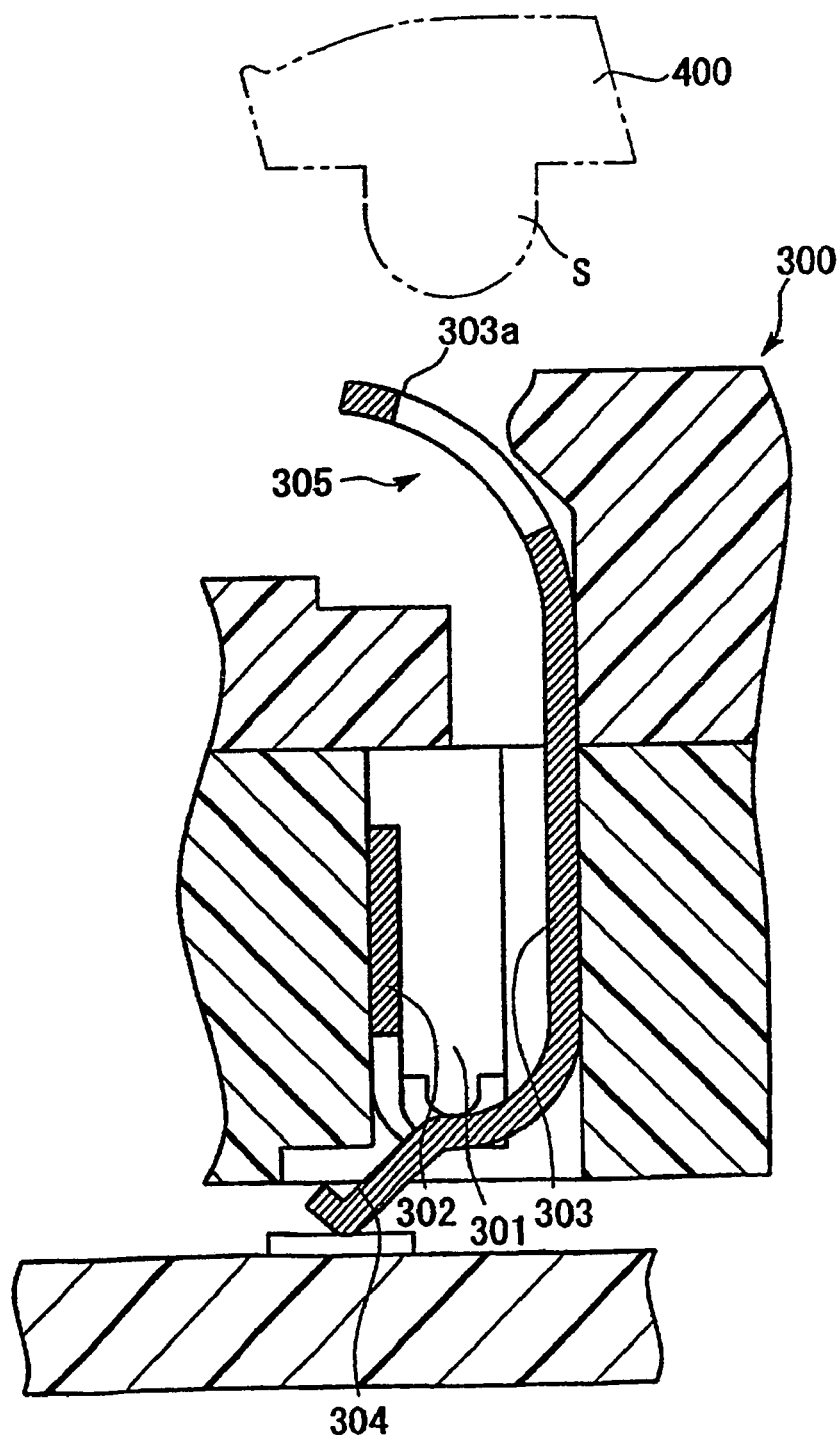
FIG. 12 is a cross-sectional view illustrating a conventional test socket.
Figure 13:
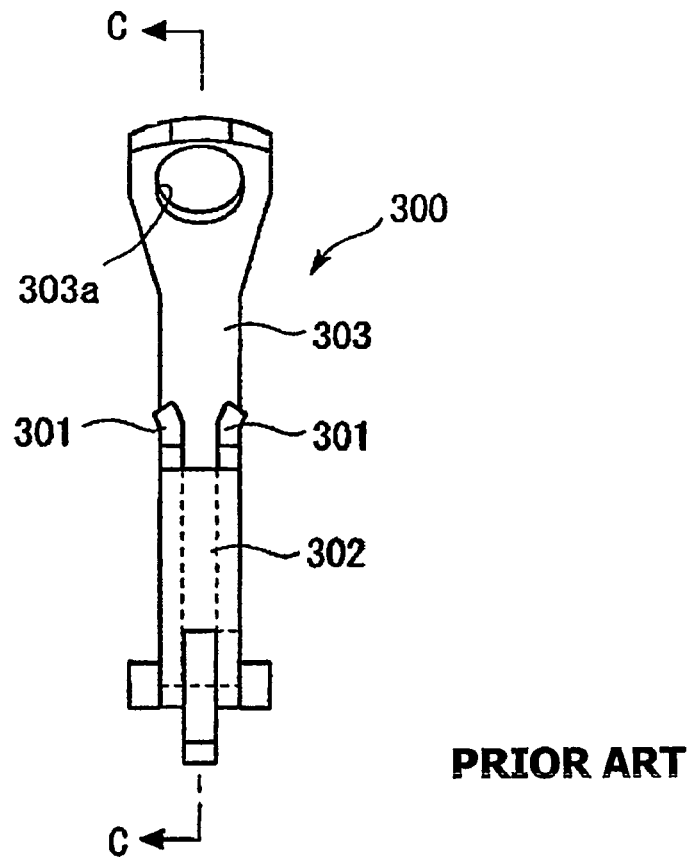
FIG. 13 is a frontal view of a contact to be mounted on the conventional test socket.
Figure 14:
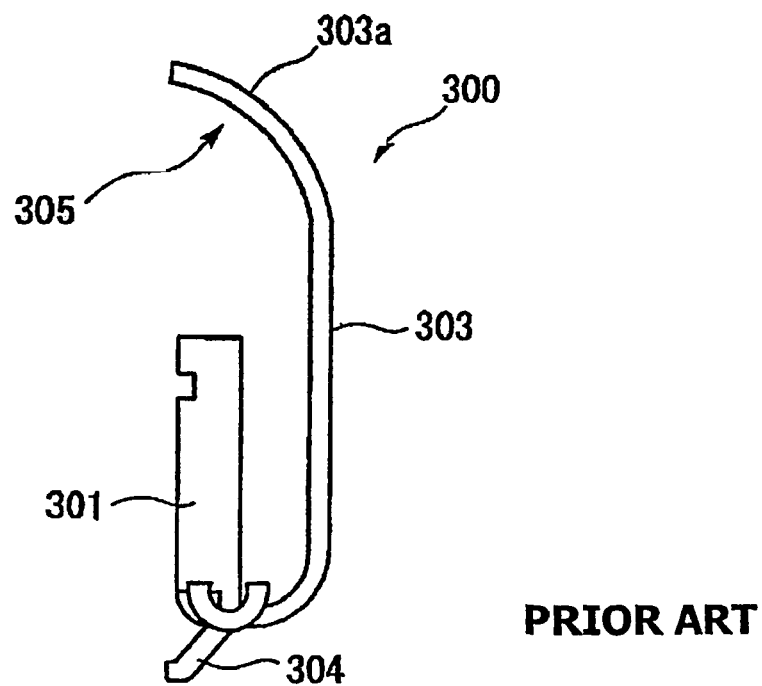
FIG. 14 a side elevational view of the contact to be mounted on the conventional test socket.
Figure 15:
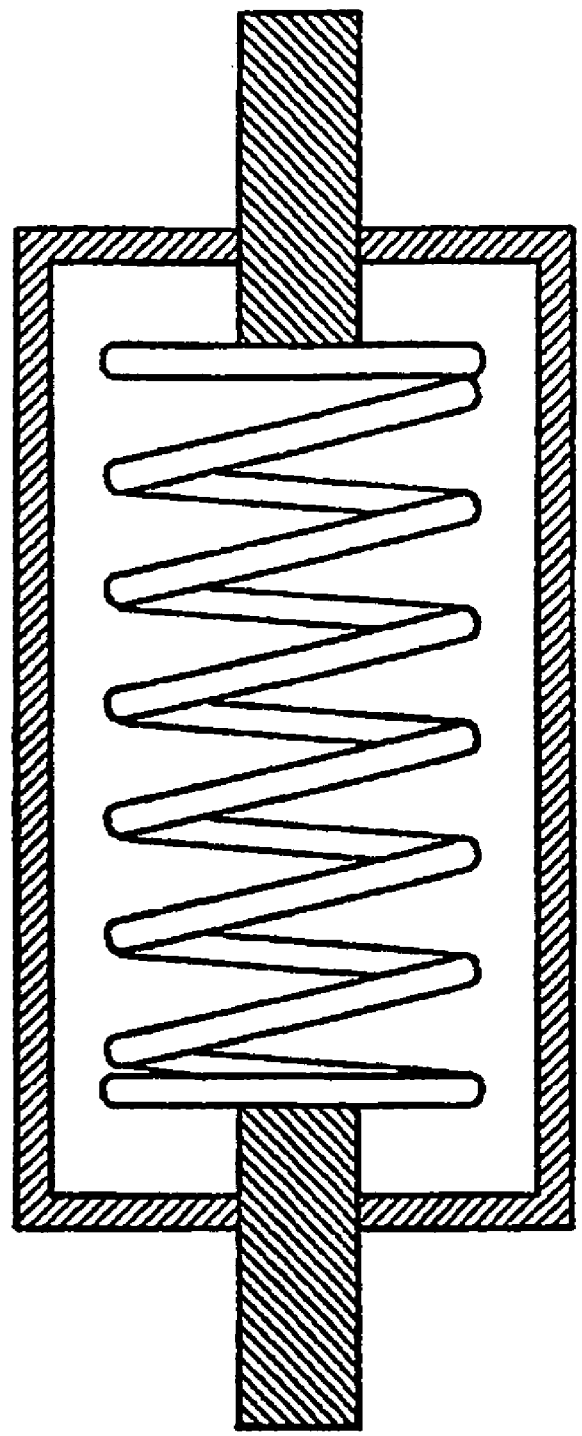
FIG. 15 is a view illustrating the contact to be mounted on the conventional test socket.
Figure 16:
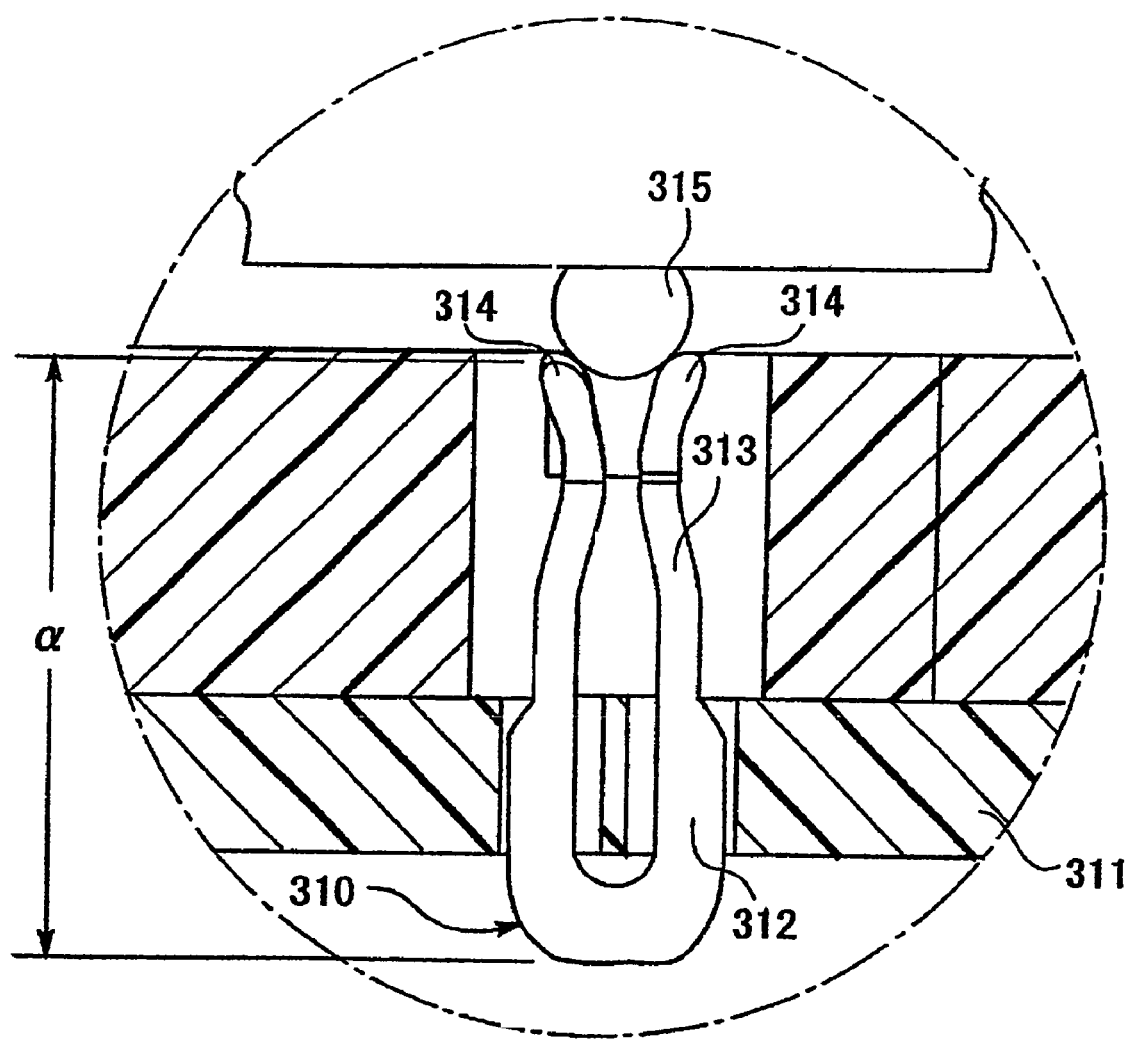
FIG. 16 is a partially enlarged cross-sectional view of the conventional test socket.

Incidentally, FIGS. 8, 9 and 10 are perspective views of the test socket TS under the condition in which the contacts 10 are mounted to all the mounting holes 11 of the socket body 15. Out of these, FIGS. 9 and 10 are perspective views seen from positions shifted by 90 degrees from each other for ease of understanding, and the FIG. 11 is a perspective view showing the back surface side.

Incidentally, the present invention is not limited to the BGA type test socket as in the foregoing embodiments but may be applied to any of the sockets of the semiconductor package such as the sockets of CSP (Chip Size Package).

As described above, according to the present invention, it is possible to provide a technique for a socket and a contact of a semiconductor package, which is capable of achieving reduction of self-inductance and high-density arrangement by reducing a height of the socket, and which also takes into consideration the contact reliability of a contact portion.

That is, the mounting hole of the contact is provided with the through-hole and the support hole, and the contact is provided with the upright piece extending along the through-hole and the support piece extending from the upright piece to be inserted into the support hole. Accordingly, the upright piece is supported to the support piece so that it may be elastically deformed. As a result, it is possible to effectively utilize the full length of the upright piece as a portion that may be elastically deformed. Thus, it is possible to attain the reduction of the self-inductance by the further reduction in height of the socket.

Also, since the upright piece takes a form such that it extends along the through-hole, it is possible to realize high-density arrangement in comparison with the case where the contacts are arranged in a horizontal manner. Also, due to such configuration that the effective spring portion of the contact is elongated, the contact is contacted with the solder ball at two points, and the contact is not press-fitted but mounted to the socket body and so on, it is also possible to enhance the contact reliability of the contact portion.

While a preferred embodiment of the present invention is shown and described, it is envisioned that those skilled in the art may devise various modifications of the present invention without departing from the spirit and scope of the appended claims.

The invention claimed is:

1. A socket of a semiconductor package for mating on a surface of a circuit substrate, comprising:
   a plurality of contacts for contacting with a plurality of solder balls arranged on one side of the semiconductor package and a socket body in which a plurality of mounting holes are provided for mounting the respective contacts, wherein:
   each of said mounting holes is provided with a through-hole pierced in a height direction of the socket body and a contact support hole;

said each of contacts is provided with an upright piece extending through the through-hole and a support piece extending from the upright piece to be inserted into the support hole from a surface of the socket body furthest away from the circuit substrate; and a contact portion to be brought into contact with the solder ball is formed at a tip end portion of the upright piece and the support piece is extending from a proximal end portion of the upright piece.

2. The socket of a semiconductor package according to claim 1, wherein said through-hole is set to a size such that the upright piece may be shifted within its interior.

3. The socket of a semiconductor package according to claim 1, wherein the support piece includes a pull-off preventing projection.

4. The socket of a semiconductor package according to claim 1, wherein said socket body is formed into a planar shape, the contact portion of each contact is arranged on its surface side, the proximal end portion of each contact is arranged on an opposing surface side, and each proximal end portion projects from the opposing surface.

5. The socket of a semiconductor package according to claim 4, wherein a recess portion having a uniform depth is provided on the surface side of the socket body furthest away from the circuit substrate and at least the contact portion of said each contact is exposed within the recess portion.

6. The socket of a semiconductor package according to claim 5, wherein a convex portion extending from an inner wall of the mounting hole is provided in the mounting hole, and the convex portion is fitted into a second curved portion of the contact.

7. The socket of a semiconductor package according to claim 1, wherein a second curved portion is located in a position in the vicinity of a substantially central portion of a length of the upright piece.

8. The socket of a semiconductor package according to claim 1, wherein a first curved portion that is curved in a generally U-shape and an inverted generally U-shaped second curved portion that is continuous with the first curved portion are formed between the upright piece and the support piece of said contact.

9. The socket of a semiconductor package according to claim 1, wherein contact portions of a pair of contacts are mounted so as to face each other in the mounting hole.

* * * * *